United States Patent [19]
Kelly

[11] Patent Number: 5,557,578
[45] Date of Patent: Sep. 17, 1996

[54] DYNAMIC MEMORY REFRESH CONTROLLER AND METHOD

[75] Inventor: James D. Kelly, Aptos, Calif.

[73] Assignee: Apple Computer, Inc., Cupertino, Calif.

[21] Appl. No.: 432,919

[22] Filed: May 1, 1995

[51] Int. Cl.⁶ ................................................. G11C 7/00
[52] U.S. Cl. .................................... 365/222; 364/926.92
[58] Field of Search ........................ 365/222; 364/926.92

[56] References Cited

U.S. PATENT DOCUMENTS

| | | | |
|---|---|---|---|
| 4,918,645 | 4/1990 | Lagoy, Jr. | 364/926.92 |
| 5,021,951 | 6/1991 | Baba | 365/222 |
| 5,031,147 | 7/1991 | Maruyama et al. | 365/222 |
| 5,283,885 | 2/1994 | Hollerbauer | 365/222 |
| 5,345,574 | 9/1994 | Sakurada et al. | 365/222 |
| 5,345,577 | 9/1994 | Chan et al. | 395/425 |
| 5,418,920 | 5/1995 | Kuddes | 365/222 |

*Primary Examiner*—David C. Nelms
*Assistant Examiner*—Trong Phan
*Attorney, Agent, or Firm*—Burns, Doane, Swecker & Mathis, L.L.P.

[57] ABSTRACT

A refresh controller and method are provided which issue refresh requests to a memory as high and low priority requests based on the number of pending refresh requests to the memory. The refresh request is determined to be a high priority request when the number of pending refresh requests to the memory is greater than or equal to a predetermined threshold number and the refresh requests are issued to the memory as low priority requests when the number of pending refresh requests to the memory is less than the predetermined threshold number. As a result, the refresh controller and method ensure that the refresh requests are executed by the memory within the required refresh period while reducing the read latency to the memory.

36 Claims, 2 Drawing Sheets

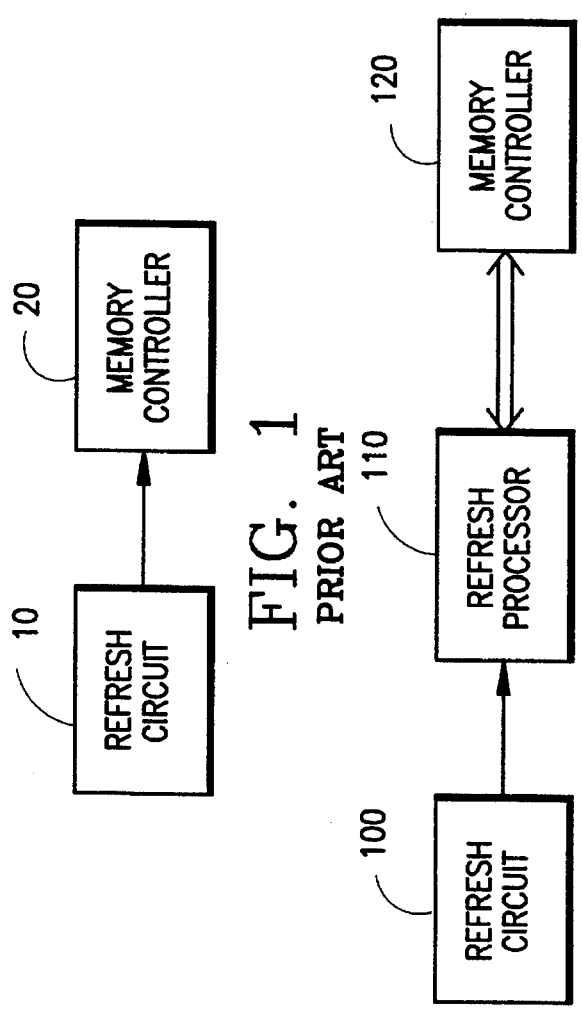
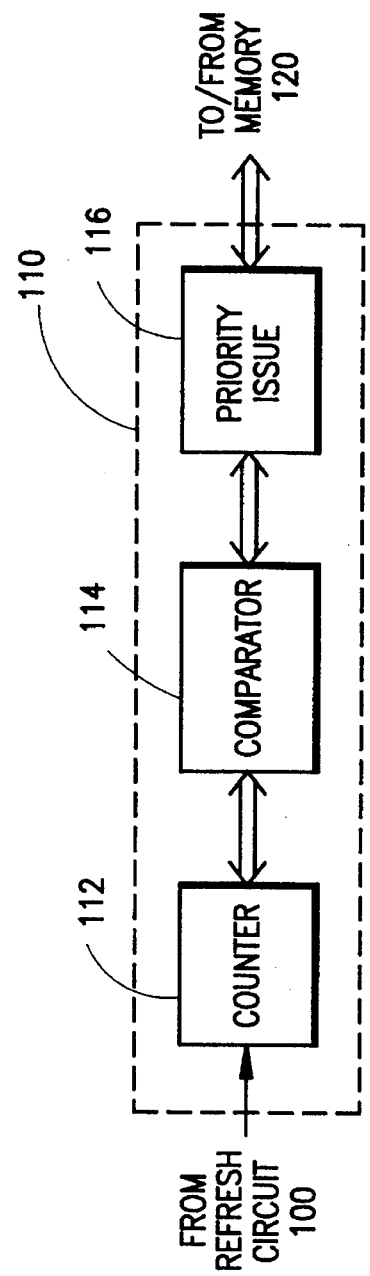

DYNAMIC MEMORY REFRESH CONTROLLER AND METHOD

BACKGROUND

The present invention is directed to a dynamic memory refresh controller and method for prioritizing the refresh requests issued to the memory based on the number of pending refresh requests to the memory. More particularly, the refresh controller and method determine the number of refresh requests that are pending to the memory and issue the refresh requests to the memory as either a high priority request or a low priority request in response to the comparison of the number of pending refresh requests to a predetermined refresh number.

In conventional dynamic memories, the time that a node reliably stores a bit is referred to as the refresh period. The refresh period is based on the particular dynamic memory specifications. Since the charge stored on a dynamic node decays, it is necessary to sense and refresh the dynamic node within the refresh period. Therefore, dynamic memories are generally interfaced to a refresh circuit which generates a refresh request within the refresh period to ensure that the charge on the dynamic node does not decay and the bit remains reliably stored on the dynamic node.

An example of a known refresh operation for a dynamic memory system is illustrated in FIG. 1. A refresh circuit 10 generates refresh requests at predetermined intervals to the memory controller 20. The predetermined intervals are chosen to be within the refresh period to ensure that data on the dynamic node reliably remains. Conventionally, the predetermined intervals are about 15 μsec. More specifically, the refresh circuit 10 generates an overflow signal at the end of the predetermined intervals. The generated overflow signals act as refresh requests which take priority before all of the other requests from an external processor (not shown). In these known systems, because the refresh requests take priority of the execution by the memory controller 20 before all of the other requests, the read latency is adversely affected due to the refreshes. For example, in the middle of a large block transfer, a read which conflicts with the refresh will be forced to wait until the refresh, which takes priority, is completed. The amount of time necessary to complete the refresh is dependent upon the number of banks in the dynamic memory and thereby, the read latency becomes higher as the number of banks is increased.

A refresh controller for a memory is therefore desired which minimizes the read latency caused by refreshes while guaranteeing refresh requests to be executed to the memory within the refresh period. The embodiments of the present invention are directed to solving the above-described refresh concerns in known dynamic memory systems so that refreshes will occur within the refresh period while keeping the read latency low.

SUMMARY

An object of the present invention is to provide a refresh controller and method which issues refresh requests to the memory as high and low priority requests based on the number of pending memory refresh requests.

Another object of the present invention is to provide a refresh controller and method for a memory which counts the number of pending refresh requests to the memory and compares the number of pending refresh requests to a predetermined threshold number. This comparison determines whether the refresh request is a high priority request or a low priority request. A high priority request allows the refresh request to issue before all of the other pending requests to the memory, and a low priority request allows the refresh request to be issued to the memory only when there are no other pending requests.

These objects of the present invention are fulfilled by providing a refresh controller for a memory comprising a refresh circuit for generating refresh requests, and a refresh processor for issuing said refresh requests to the memory as high and low priority requests based on the number of pending refresh requests to the memory. As a result, the refresh controller ensures that refresh requests are issued to the memory within the refresh period for the memory while reducing the read latency to the memory.

The objects of the present invention are also fulfilled by providing a method for controlling a refresh request to a memory comprising the steps of generating refresh requests, and issuing said refresh requests to the memory as high and low priority requests based on the number of pending refresh requests to the memory. Similarly, this method ensures that the refresh requests are issued to the memory within the refresh period while reducing the read latency to the memory.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the invention, wherein:

FIG. 1 illustrates a refresh controller for a known memory system;

FIG. 2 illustrates a refresh controller for a memory system according to an embodiment of the present invention;

FIG. 3 illustrates a more detailed block diagram of the refresh processor illustrated in FIG. 2 for an embodiment of the present invention.

DETAILED DESCRIPTION

Figure 4A:
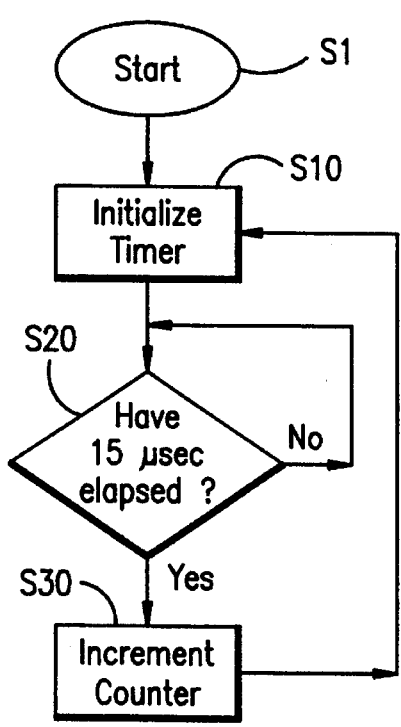
FIGS. 4(a) and 4(b) illustrate flow charts of the refresh operation performed by the controller in an embodiment of the present invention.

A refresh controller is shown in FIG. 2 according to an embodiment of the present invention. FIG. 2 illustrates a refresh circuit 100 for generating refresh requests, a refresh processor 110 for receiving the refresh requests from the refresh circuit 100 and issuing the refresh requests with a corresponding priority and a memory controller 120 which receives the refresh requests along with the associated priority from the refresh processor 110. The memory controller 120 may control any dynamic memory such as a DRAM, a VRAM, or a synchronous DRAM.

The refresh circuit 100 operates similar to the refresh circuit in known dynamic memory control systems. The refresh circuit 100 generates refresh requests at predetermined intervals by generating an overflow signal at the end of each predetermined interval, for example. The refresh processor 110 receives each refresh request from the refresh circuit 100 and determines the refresh request to be either a high or low priority request based on the number of pending refresh requests to the memory. Finally, the memory controller 120 receives the refresh requests and the associated priority for possible execution of the refresh request by an executing portion (not shown) included in the memory controller 120. The executing portion of the memory controller 120 executes the refresh requests issued as high priority requests before all other pending requests to the memory controller 120 and executes the refresh requests issued as low priority requests only when there are no other pending requests to the memory controller 120. As a result, the overall forward progress of the refresh operation is guaranteed while the read latency to the memory is lowered.

FIG. 3 shows a more detailed block diagram of the refresh processor 110. FIG. 3 illustrates the refresh processor 110 to include a counter 112, a comparator 114, and a priority issuing unit 116. The counter 112 receives the refresh requests from the refresh circuit 100 at the predetermined intervals and increments the counter 112 by one every time a refresh request is received. The comparator 114 compares the value of the counter 112 with a predetermined threshold number to determine whether the refresh request should be issued as a high or low priority request. If the value of the counter 112 is greater than or equal to the predetermined threshold number, the refresh request is sent to the memory controller 120 from the priority issuing unit 116 as a high priority request. However, if the value of the counter is less than the predetermined threshold number, the priority issuing unit 116 issues the refresh request to the memory controller 120 as a low priority request. Also, whenever a refresh is performed, the counter 112 is decremented by one. Accordingly, the refresh processor 110 issues the refresh request to the memory controller 120 as high and low priority requests based on the number of pending refresh requests wherein the high priority refresh requests are executed by the memory controller 120 before all other pending requests and the low priority refresh requests are executed by the memory 120 only when there fails to be any other pending requests.

The predetermined threshold number is determined based on the average length of the burst transfer. Thereby, the predetermined refresh number may be any value between 1 and the number of columns of the dynamic memory in a burst mode. The predetermined threshold number is therefore chosen from these limits based on the desired application. For example, in video applications, having 4K scan lines, a predetermined threshold number of 3 or 4 will generally ensure a proper operation.

Figure 4B:
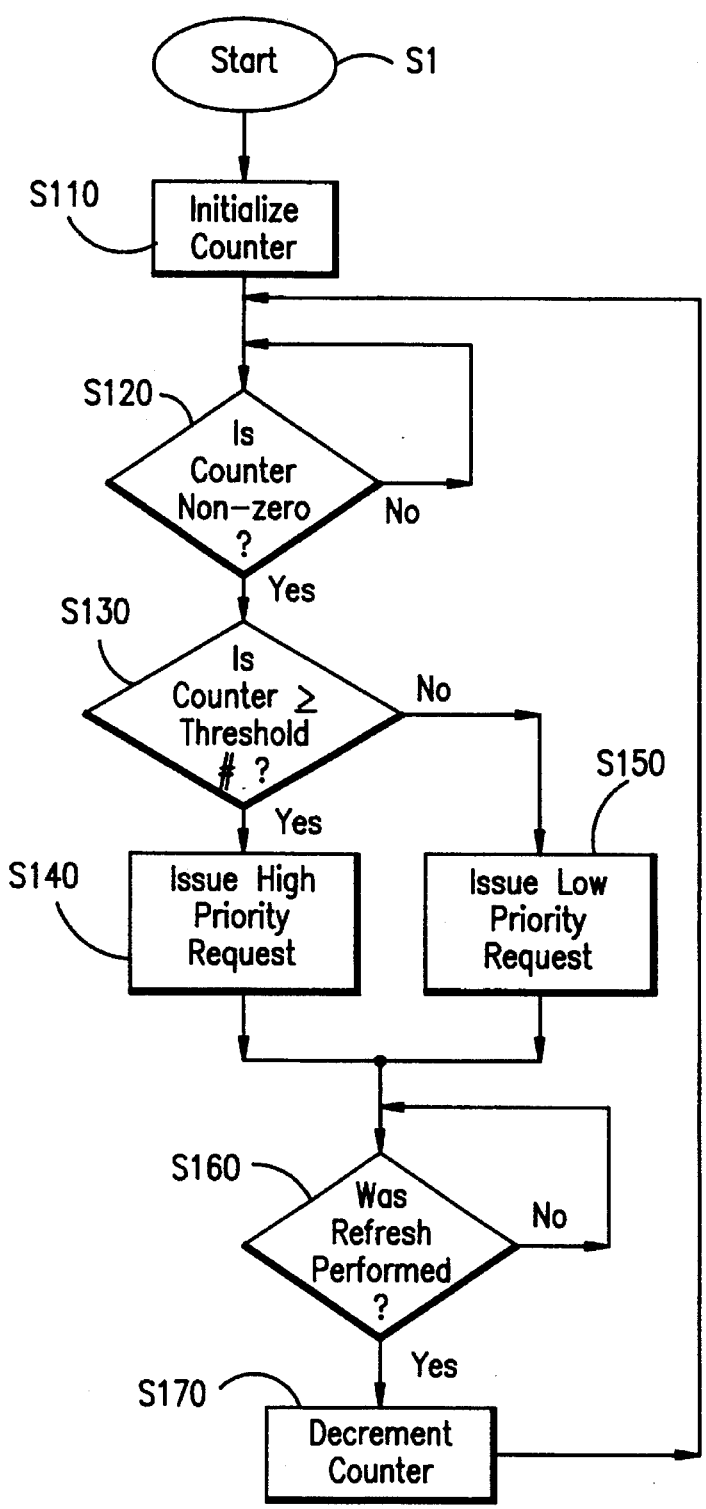

FIGS. 4(a) and 4(b) illustrate flow charts of the concurrent processes performed by the refresh controller. In FIG. 4(a), the timer is initialized at step S10 by being reset to zero. At step S20, it is determined whether 15 microseconds have elapsed. If 15 μsec have not elapsed, step S20 is repeatedly cycled until the 15 μsec have elapsed. After step S20 determines that the 15 μsec have elapsed, the counter 112 is incremented at step S30. Concurrently with incrementing the counter when the timer overflows, the refresh requests are prioritized as shown in FIG. 4(b). At step S110, the counter 112 is initialized. Step S120 determines whether the counter 112, as incremented in the process shown in FIG. 4(a) is not zero. If the counter 112 is zero, step S120 is repeatedly cycled until the counter 112 is incremented and becomes non-zero. When the counter 112 is determined to be non-zero at step S120, the value of the counter 112 is compared with the predetermined threshold number. If the value of the counter 112 is greater than or equal to the predetermined threshold number, a high priority request is issued at step S140. If the counter is less than the predetermined threshold number, a low priority request is issued at step S150. Next, step S160 determines whether the refresh was performed. If the refresh was not performed, step S160 is repeatedly cycled until the refresh is performed. After performing the refresh at step S160, the counter 112 is decremented by 1 at step S170 and proceeds back to step S120.

The refresh controller and method described in the embodiments of the present invention issue refresh requests to a memory as high and low priority requests based on the number of pending refresh requests to the memory. The refresh controller and method for these embodiments are especially applicable to dynamic memories where the refresh requests must be performed within a refresh period to ensure that the bit stored at the dynamic node will not decay and thereby remain reliable. Since it is not necessary to perform refresh operations at predetermined intervals, it is possible to delay refresh operations as long as the memory is completely refreshed at some time during the refresh period. Therefore, read operations may be performed on the memory in place of unnecessary refresh operations so that the read latency of the memory is lowered. The issuing of refresh requests to the memory within the predetermined threshold number is necessary to guarantee forward progress of refreshes. For example, if the memory system is in the middle of a large block transfer, it is possible for refresh requests to be "choked." The predetermined threshold number is determined so that the refresh requests are not "choked" and the refresh requests will be performed within the refresh period of the memory to ensure that reliable data are at the memory nodes. As a result, the embodiments of the present invention ensure that the refresh operations are timely performed while lowering the read latency to the memory.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A refresh controller for a memory comprising:

a refresh circuit for generating refresh requests; and a refresh processor for issuing said refresh requests to the memory as high and low priority requests based on the number of pending refresh requests to the memory.

2. A refresh controller according to claim 1, wherein the memory comprises a dynamic memory.

3. A refresh controller according to claim 1, wherein said refresh circuit generates said refresh requests at predetermined time intervals.

4. A refresh controller according to claim 3, wherein said predetermined time intervals are 15 μsec.

5. A refresh controller according to claim 1, wherein said refresh processor includes, a refresh counter for counting the number of pending refresh requests to the memory from said refresh circuit, a refresh comparator tier comparing the number of pending refresh requests to a predetermined threshold number, and a prioritizing unit for issuing said refresh requests to the memory as said high priority requests when the number of pending refresh requests is greater than or equal to said predetermined threshold number and as said low priority requests when the number of pending refresh requests is less than said predetermined threshold number.

6. A refresh controller according to claim 1, further comprising an executing unit for executing said refresh requests issued as high priority requests before all other pending requests to the memory and said refresh requests issued as low priority requests only when there fails to be any other pending requests to the memory.

7. A system for prioritizing refresh requests to a memory comprising:

a refresh circuit for generating refresh requests; and a refresh processor for issuing said refresh requests to the memory at a first priority when the number of pending refresh requests is less than a predetermined threshold number and at a second priority when the number of pending refresh requests is greater than or equal to said predetermined priority number.

8. A system according to claim 7, wherein the memory comprises a dynamic memory.

9. A system according to claim 7, wherein said refresh circuit generates said refresh requests at predetermined intervals.

10. A system according to claim 9, wherein said predetermined time intervals are 15 μsec.

11. A system according to claim 7, wherein said refresh processor includes, a refresh counter for counting the number of pending refresh requests to the memory from said refresh circuit, a refresh comparator for comparing the number of pending refresh requests to said predetermined threshold number, and a prioritizing unit for issuing said refresh requests to the memory at said first and second priorities.

12. A system according to claim 7, wherein said first priority enables said refresh requests to be executed only when there fails to be any other pending requests to the memory and said second priority enables said refresh requests to be executed before all other pending requests.

13. A refresh controller for a memory comprising:

a refresh circuit for generating refresh requests; and a refresh counter for counting the number of pending refresh requests to the memory from said refresh circuit and comparing the number of pending refresh requests to a predetermined threshold number, said refresh counter issuing said refresh requests to the memory as high priority requests when the number of pending refresh requests is greater than or equal to said predetermined priority number and as low priority requests when the number of pending refresh requests is less than said predetermined threshold number.

14. A refresh controller according to claim 13, wherein the memory comprises a dynamic memory.

15. A refresh controller according to claim 13, wherein said refresh circuit generates said refresh requests at predetermined time intervals.

16. A refresh controller according to claim 15, wherein said predetermined time intervals are 15 μsec.

17. A refresh controller according to claim 13, wherein said predetermined threshold number is 3.

18. A refresh controller according to claim 13, wherein said refresh requests issued as high priority requests are executed by the memory before all other pending requests to the memory and said refresh requests issued as low priority requests are only executed by the memory when there fails to be any other pending requests to the memory.

19. A method for controlling refresh requests to a memory comprising the steps of:

(a) generating refresh requests; and (b) issuing said refresh requests to the memory as high and low priority requests based on the number of pending refresh requests to the memory.

20. A method according to claim 19, wherein the memory comprises a dynamic memory.

21. A method according to claim 19, wherein said step (a) generates said refresh request at predetermined intervals.

22. A method according to claim 21, wherein said predetermined intervals are 15 μsec.

23. A method according to claim 19, wherein said step (b) includes the steps of, (b)(1) counting the number of refresh requests generated at said step (a), (b)(2) comparing the number of pending refresh requests to a predetermined threshold number, and (b)(3) issuing said refresh requests to the memory as said high priority requests when the number of pending refresh requests is greater than or equal to said predetermined threshold number and as said low priority requests when the number of pending refresh requests is less than said predetermined threshold number.

24. A method according to claim 19, further comprising the step of executing said refresh requests issued as high priority requests before all other pending requests to the memory and said refresh requests issued as low priority requests only when there fails to be any other pending requests to the memory.

25. A method for prioritizing refresh requests to a memory comprising the steps of:

(a) generating refresh requests; and (b) issuing said refresh requests to the memory at a first priority when the number of pending refresh requests is less than a predetermined threshold number and at a second priority when the number of pending refresh requests is greater than or equal to said predetermined threshold number.

26. A method according to claim 25, wherein the memory comprises a dynamic memory.

27. A method according to claim 25, wherein said step (a) generates said refresh requests at predetermined intervals.

28. A method according to claim 27, wherein said predetermined intervals are 15 μsec.

29. A method according to claim 25, wherein said step (b) includes the steps of, (b)(1) counting the number of pending refresh requests to the memory, (b)(2) comparing the number of pending refresh requests to said predetermined threshold number, and (b)(3) issuing said refresh requests to the memory at said first and second priorities.

30. A method according to claim 25, wherein said first priority enables said refresh requests to be executed only when there fails to be any other pending requests to the memory and said second priority enables said refresh requests to be executed before all other pending requests.

31. A method for controlling refresh requests to a memory comprising the steps of:
- (a) generating refresh requests;
- (b) counting the number of pending refresh requests generated to the memory at said step (a);
- (c) comparing the number of pending refresh requests to a predetermined threshold number; and
- (d) issuing said refresh requests to the memory as high priority requests when the number of pending refresh requests is greater than or equal to said predetermined threshold number and as low priority requests when the number of pending refresh requests is less than said predetermined threshold number.

32. A method according to claim 31, wherein the memory comprises a dynamic memory.

33. A method according to claim 31, wherein said step (a) generates said refresh requests at predetermined time intervals.

34. A method according to claim 33, wherein said predetermined time intervals are 15 μsec.

35. A method according to claim 31, wherein said predetermined threshold number is 3.

36. A method according to claim 31, further comprising the step of executing said refresh requests issued as high priority requests before all other pending requests to the memory and said refresh requests issued as low priority requests only when there fails to be any other pending requests to the memory.

* * * * *